United States Patent [19]

Ryan et al.

[11] Patent Number: 4,731,339
[45] Date of Patent: Mar. 15, 1988

[54] PROCESS FOR MANUFACTURING METAL-SEMICONDUCTOR FIELD-EFFECT TRANSISTORS

[75] Inventors: Frank J. Ryan, Agoura; Mau-Chung F. Chang, Thousand Oaks, both of Calif.; Dennis A. Williams, Colorado Springs, Colo.; Richard P. Vahrenkamp, Camarillo, Calif.

[73] Assignee: Rockwell International Corporation, El Segundo, Calif.

[21] Appl. No.: 899,574

[22] Filed: Aug. 25, 1986

[51] Int. Cl.$^4$ .............................................. B44C 1/22
[52] U.S. Cl. ........................................ 437/29; 357/49; 357/65; 357/41; 156/653; 156/657; 156/659.1; 156/668; 156/661.1; 437/41; 437/187; 437/924; 437/944; 430/315; 430/317
[58] Field of Search .................... 29/571, 571 B, 579, 29/578; 148/187; 357/41, 91; 156/643, 653; 437/29, 40, 41

[56] References Cited

U.S. PATENT DOCUMENTS

| 4,449,285 | 5/1984 | Janes et al. .......................... 29/571 |
| 4,532,004 | 7/1985 | Akiyama et al. ..................... 29/571 |
| 4,546,540 | 10/1985 | Ueyanagi et al. ................... 29/579 |
| 4,601,095 | 7/1986 | Kikuchi et al. .................. 29/576 B |
| 4,670,090 | 6/1987 | Sheng et al. ....................... 156/653 |

OTHER PUBLICATIONS

"Self-Aligned Dummy Gate Sidewall-Spaced MESFET", IBM Technical Disclosure Bulletin, vol. 28, No. 7, Dec. 1985, pp. 2767-2768.
P. C. Chao, "0.2 Micron Length T-Shaped Gate Fabrication Using Angle Evaporation", IEEE Electron Device Letters, vol. EDL-4, No. 4, Apr. 1983.
Yamasaki, "GaAs Self-Aligned MESFET Technology: SAINT", Review of the Electrical Communication Laboratories, vol. 33, No. 1, 1985.
Kato et al., "Influence of n+-Layer-Gate Gap on Short-Channel Effects of GaAs Self-Aligned MESFET's (SAINT), IEEE Electron Device Letters, vol. EDL-4, No. 11, 11-85.
Bartle et al., "Selective Area Ion Implantation for Gallium Arsenide Microwave Devices and Circuits", GEC Journal of Research, vol. 1(3), 1983, pp. 174-177.
Ohta et al., "A New Structure GaAs MESFET with a Selectively Recessed Gate", IEEE Transactions on Electronic Devices, vol. ED-31, No. 3, Mar. 1984, pp. 389-390.
Yamasaki et al., GaAs LSI-Directed MESFET's with Self-Aligned Implantation for n+-Layer Technology (SAINT), IEEE Transactions on Electron Devices, vol. ED 29, No. 11, 11-82.

Primary Examiner—Brian E. Hearn
Assistant Examiner—Beverly A. Pawlikowski
Attorney, Agent, or Firm—H. Fredrick Hamann; Craig O. Malin

[57] ABSTRACT

A single-level photoresist process is used to make metal-semiconductor field-effect transistors (MESFETs) having more uniform threshold voltages. An N$^-$ layer is formed in a semi-insulating semiconductor, followed by formation of a dummy gate using a single-level photoresist process. Using the dummy gate as a mask, ions are implanted to form an N$^+$ region. The length of the dummy gate is then reduced by plasma etching. A dielectric is deposited over the N$^+$ region, the N$^+$/N$^-$ interface, and the exposed portion of the N$^-$ layer. The dummy gate is lifted off to define a self-aligned, submicron gate opening. The gate opening on the N$^-$ layer is reactive ion etched to obtain the desired threshold voltage, and covered with a Schottky gate metal deposit.

8 Claims, 10 Drawing Figures

PROCESS FOR MANUFACTURING METAL-SEMICONDUCTOR FIELD-EFFECT TRANSISTORS

BACKGROUND OF THE INVENTION

This invention relates to the field of solid state electronics, and particularly to a single-level photoresist process for producing metal-semiconductor field-effect transistors (MESFETs) with submicron gates and with uniform threshold voltages.

MESFETs used in integrated circuits require precise control of threshold voltage in order to obtain good performance and large-scale integration. It is necessary to obtain the targeted threshold voltage on wafers cut from different boules (boule to boule uniformity) and on wafers cut from a single boule. The across-wafer uniformity is limited by surface nonuniformities that are introduced by integrated circuit processing such as wet recessing.

Several self-alignment implantation processes have been published for fabricating submicron gate MESFETs. A tri-level resist process (K. Yamasaki, et al., ELECTRONIC LETTERS, Vol. 18, pp. 119–121, 1982) has been used to deposit a T-bar shaped dummy gate consisting of photoresist, sputtered- $SiO_2$ and PMMA. The bottom layer of the gate (FPM) is undercut using reactive ion etching. Undercutting to form the T-bar shape is done before implanting the $N^+$ regions and before depositing the $SiO_2$ dielectric. This T-shape shields a fringe portion of the underlying $N^-$ channel during $N^+$ implantation, while still allowing later deposition of the $SiO_2$ dielectric over the $N^+$ region, the $N^+/N^-$ interface, and the shielded portions of the $N^-$ channel.

A dual-level resist process (M. F. Chang et al, IEEE ELECTRON DEVICE LETTERS, Vol. EDL-6, No. 6, June 1985) uses photoresist and PMMA to develop a T-bar shaped dummy gate. Instead of undercutting the dummy gate by receiving ion etching as described above, a deep ultraviolet exposure of the PMMA is used to provide undercutting. As in the Yamasaki, et al process, undercutting is done before implanting the $N^+$ regions so that the top of the dummay gate protects a fringe around the reduced gate from $N^+$ implantation. A dry gate recessing process for achieving uniform threshold voltage is mentioned, but details of the process are not given.

A process which uses an $SiO_2$ dummy gate that is covered with a photoresist (M. Hagio, et al, IEEE TRANSACTIONS ON ELECTRON DEVICES, Vol. ED-33, No. 6, June 1986) relies upon sidewall deposition (and later removal) of $Si_3N_4$ on the dummy gate to provide a separation gap (or fringe) between the dummy gate and the $N^+$ region.

Although prior art methods are capable of producing MESFETs with submicron gates, a continuing need exists for methods which are more economical, reliable, and which provide uniform threshold voltages for the many MESFETs in a single integrated circuit.

SUMMARY OF THE INVENTION

It is an object of the invention to provide a single-level photoresist process for fabricating metal-semiconductor field-effect transistors (MESFETs) which have a more uniform threshold voltage.

It is an object of the invention to provide a single-level photoresist process for fabricating MESFETs which have a targeted threshold voltage.

It is an object of the invention to provide a single-level photoresist process for fabricating MESFETs with submicron gate lengths.

According to the invention, an $N^-$ channel layer is formed by ion implantation through a thin $Si_3N_4$ film on a semi-insulating semiconductor. A 0.9 to 1.0 micron dummy gate is formed on the layer using a single-level photoresist. The dummy gate is then used as a mask while ions are implanted in the layer to form an $N^+$ region. The size of the dummy gate is then reduced to a submicron length by plasma etching of the photoresist.

A dielectric is deposited over the $N^+$ region, over the $N^+/N^-$ interface, and over that fringe portion of the $N^-$ layer which was exposed when the length of the dummy gate was reduced. The dummy gate is then lifted off to define a self-aligned, submicron gate opening.

Annealing, dry etching, and ohmic metal depositing follow to provide the source and the drain. The gate opening on the channel is reactive ion etched (recessed) with $CF_4$ and $H_2$ to obtain the desired threshold voltage. Finally, Schottky metal is deposited in the submicron opening to form the gate of a metal-semiconductor field-effect transistor.

These and other features of the invention will be apparent from the following detailed description taken with reference to the accompanying drawings.

DESCRIPTION OF THE PREFERRED EMBODIMENT

A single-level photoresist process using reactive ion etching of a dummy gate and channel recessing has been developed to provide MESFETs having uniform threshold voltages. The steps in this process are illustrated in FIG. 1.

Figure 1A:
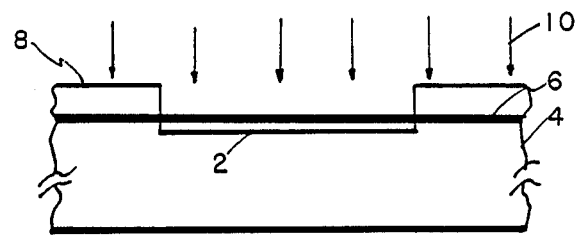
FIG. 1 illustrates steps 1A–1F used to fabricate a MESFET according to the invention.
Figure 1B:
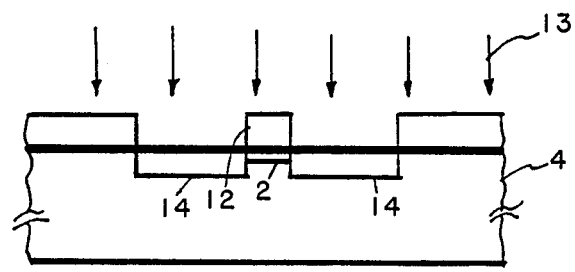

An $N^-$ channel layer 2 is formed in a semi-insulating GaAs substrate 4 by ion implantation of Se ions 10 through a thin film 6 of $Si_3N_4$. Photoresist 8 is used to define the location of $N^-$ layer 2 as shown in FIG. 1A. A dummy gate 12 about 0.7 to 1.0 micron long is formed on film 6 by means of photolithography. $N^+$ regions 14 are formed in substrate 4 by ion implantation of Si ions 13. Dummy gate 12 masks $N^-$ layer 2 in the location of the dummy gate, as shown in FIG. 1B.

Figure 1C:
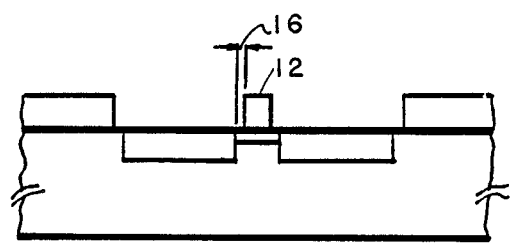

After $N^+$ implantation of regions 14, the length of dummy gate 12 is reduced by plasma etching in $O_2$ plasma. Dimension 16 in FIG. 1C shows the amount of reduction on each side of the dummy gate.

Figure 1D:
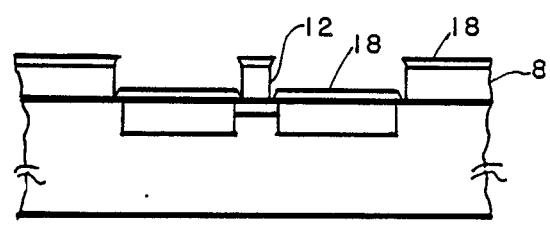
Figure 1E:
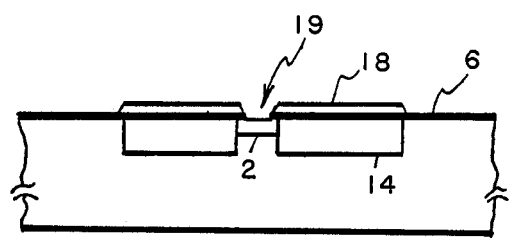
Figure 1F:
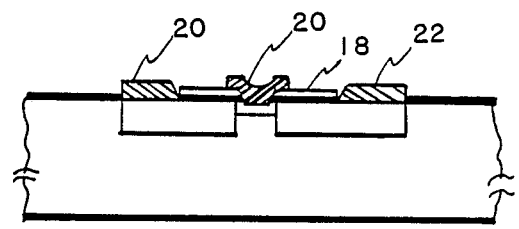

As shown in FIG. 1D, about 0.2 microns of an SiO$_x$ film 18 is deposited by evaporation on the upper exposed surfaces. The photoresist 8 (including dummy gate 12) is then lifted off, thus removing the SiO$_x$ film 18 except from its location on the Si$_3$N$_4$ film 6 above the N+ regions 14, as shown in FIG. 1E. About a 0.2 micron fringe of SiO$_x$ is left on the N− layer 2 as a result of the reduction (dimension 16) in dummy gate 12. The sharp breakage of the SiO$_x$ film 18 during evaporation permits precise submicron gate length openings. Openings in the range of 0.4 to 0.6 microns after liftoff have been obtained.

The wafer with its N− layer 2 and N+ regions 14 is then annealed at a suitable temperature (for example, 850° C. for 12 minutes) to minimize undesired lateral diffusion of N+ species into the gate region. Source and drain contacts are opened by dry etching through the SiO$_x$ and then Si$_3$N$_4$ films. Ohmic metal (Au Ge/Ni) is deposited, lifted, and alloyed to form source 20 and drain 22.

Interconnections and gate openings are delineated by photoresist followed by plasma etching of the sputtered Si$_3$N$_4$ film 6. Because CF$_4$ plasma etches Si$_3$N$_4$ faster than SiO$_x$, the separation between the edges of the evaporated SiO$_x$ film 18 is not significantly increased, thus maintaining the submicron length of the gate opening.

Figure 2:
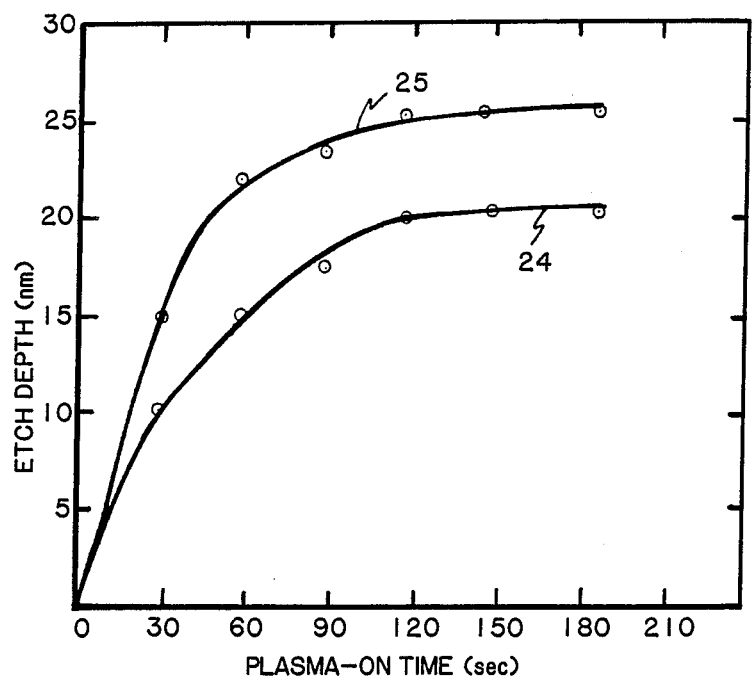
FIG. 2 shows the relation between the etch depth obtained in GaAs and the plasma etching time for etching with two different radio frequency (rf) powers.

Before gate metallization 20, gate opening 19 in channel layer 2 is recessed using a reactive ion etch (RIE) of CF$_4$/H$_2$ at a sufficient power to obtain the desired threshold voltage. It is important to adjust the gas mixtures used for RIE of the GaAs to slow the etch rate of the SiO$_x$ and preserve the submicron length of the gate opening which is defined by SiO$_x$ film 18. Empirical tests are run to determine the etching conditions required to obtain the desired recessing and threshold voltage. For example, curve 24 in FIG. 2 is the result obtained by reactive ion etching GaAs test diodes in a mixture of CF$_4$ and H$_2$ at an rf power of 100 watts. The etch depth levels off at about 20 nm after 120 seconds. Curve 25 is the result obtained under similar conditions at an rf power of 185 watts. The higher power setting also exhibited a self-limiting etch phenomena. However, the etching leveled off at a greater depth (25 nm) after 120 seconds.

Figure 3:
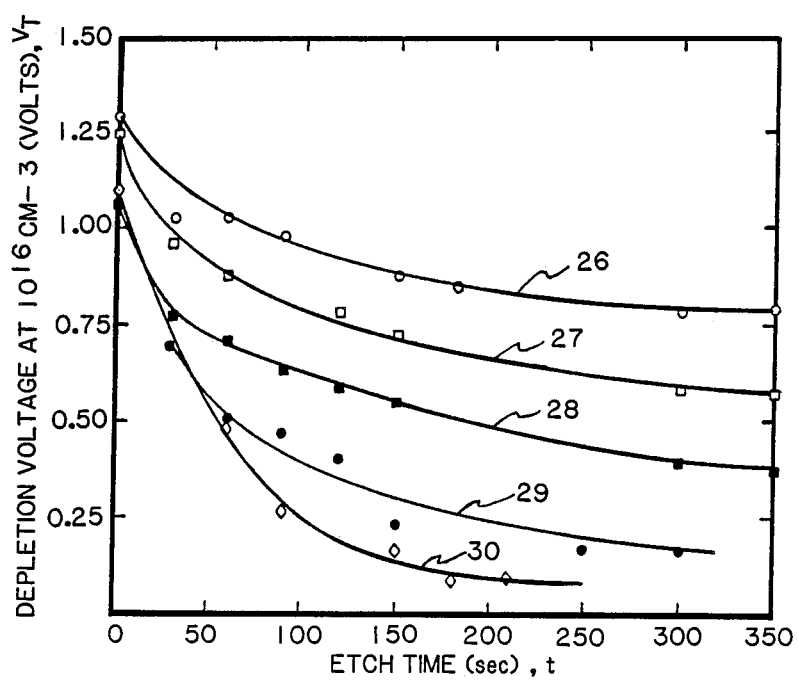
FIG. 3 shows the relation between plasma etching time and the depletion voltage for GaAs Schottky diodes etched at several different rf power levels.

FIG. 3 shows the Schottky depletion voltage (V$_t$) obtained in GaAs diodes which have a Se ion implanted N− layer with an implant dose of 2.5×10$^{12}$ cm-2. The Schottky metal was a TiPtAu combination covering an area of 6.45×10$^{-4}$ cm$^2$. The ion implanted N− layer was etched in a plasma formed in CF$_4$ and H$_2$ at rf power of 100, 115, 130, 150, and 300 watts for curves 26, 27, 28, 29, and 30 respectively. The higher the rf power, the lower the resulting depletion voltage at saturation. These curves show that the self-limiting etching phenomena in FIG. 2 also applies to the depletion voltage obtained after plasma etching the Si$_3$N$_4$ and depositing the Shottky gate metal. Also of importance is the fact that the value of the voltage can be selected based upon the rf power used during reactive ion etching.

Figure 4:
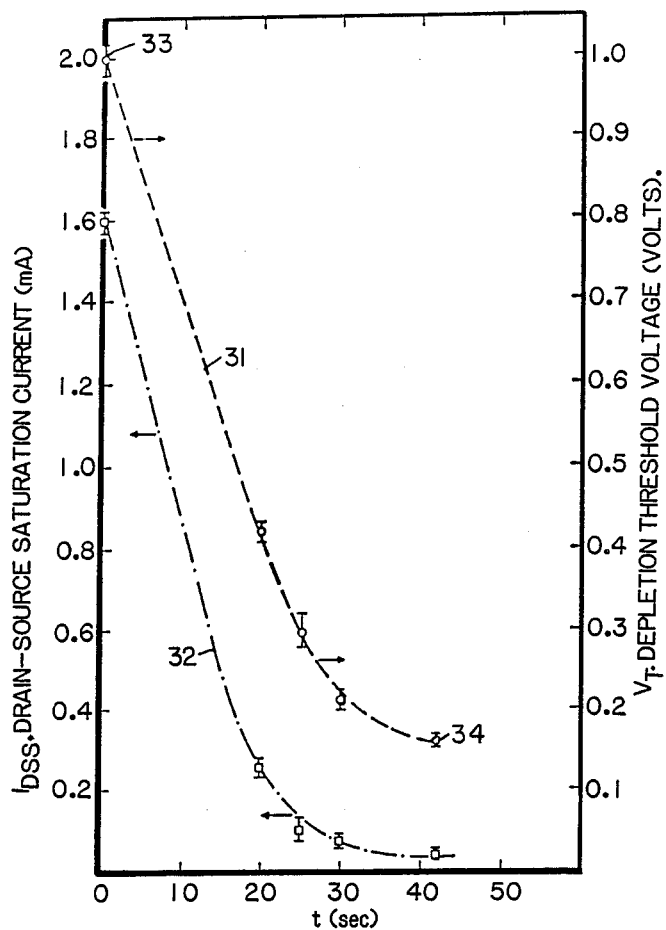
FIG. 4 shows the drain-source saturation current and the threshold voltage obtained for several MESFETs as a function of plasma etching time.

FIG. 4 shows the results of applying the method of the invention to E-MESFETs. Curves 31 and 32 show the average threshold voltage (V$_t$) and drain to source currents at saturation (I$_{dss}$) for 44 horizontal FETs per point versus elapsed etch time. Etching was done at 425 W in a mixture of CF$_4$ and H$_2$. As long as the etch time exceeds a minimum value (about 30 seconds for the devices shown in FIG. 4), the threshold voltage for E-MESFETs and D-MESFETs can be varied by changing just the rf power level used during dry etching. FIG. 3 clearly shows that increasing rf power level leads to a larger change in threshold voltage, and FIG. 4 shows how this phenomena can be applied to MESFETs by selecting a power level and chamber condition to create a self-limiting etch depth, and provide a selected threshold voltage for MESFET production.

In addition to providing a method of adjusting the threshold voltage to a desired level, the invention has the advantage of providing MESFETs with more uniform threshold voltage. This is illustrated in FIG. 4 by the spread in values among the 44 FETs tested at each data point. For example, the spread in threshold voltage among the 44 FETs which were not dry etched about 0.04 volts as shown at point 33. However, the spread in threshold voltage was only about 0.02 after dry etching for 42 seconds as shown at point 34.

Figure 5:
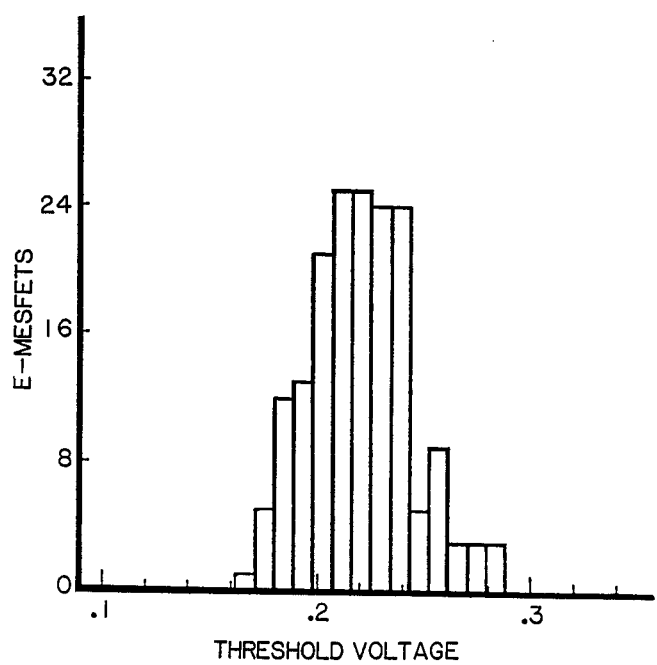
FIG. 5 is a bar chart showing the distribution of threshold voltage for 173 MESFETs with a gate length of 0.9 micron and a gate width of 50 microns, processed according to the invention.

Typical threshold voltages for 0.9 micron gate length, dry recessed, self-aligned GaAs E-MESFETs are shown in FIG. 5. The average threshold voltage for 173 E-MESFETs on a wafer was 0.2193 v. Excellent across-wafer uniformity is evident by comparing the threshold voltage and standard deviation of 23.5 mv for the whole wafer with a standard deviation of 21 mv when the wafer edge is excluded.

Numerous variations can be made without departing from the invention. For example, III-V compounds other than GaAs and gaseous etchants other than fluorocarbon mixtures can be used. The process can be used to make high electron mobility transistors (HEMT). Accordingly, it should be understood that the form of the invention described above is illustrative and is not intended to limit the scope of the invention.

What is claimed is:

1. A method of forming a metal-semiconductor field-effect transistor (MESFET) comprising the steps of:
   providing a semiconductor having a dielectric film;
   implanting ions through said dielectric film to form an N− layer in a selected area of said semiconductor;
   forming a dummy gate on said dielectric film over said N− layer using a single-level photoresist process;
   implanting ions through said dielectric film to form an N+ region in said selected area while using said dummy gate to mask said N− layer and retain an N− layer for the gate of said MESFET;
   reducing the length of said dummy gate by reactive ion etching;
   depositing an SiO$_x$ dielectric on said dielectric film covering said N+ implanted region and on the portion of said N− layer not covered by said dummy gate, while using said dummy gate to mask the underlying portion of said N− layer;
   lifting off said dummy gate;
   annealing said N− layer and said N+ region;
   etching source and drain openings in said dielectric film and in said SiO$_x$ dielectric;
   depositing ohmic metal contacts in said openings to form the source and drain of said MESFET;
   recessing said N− layer by exposing it to a reactive ion etch plasma to obtain the desired threshold voltage; and
   depositing gate metallization on said N− layer.

2. The method as claimed in claim 1 wherein said semiconductor comprises semi-insulating gallium arsenide and said dielectric film comprises silicon nitride sputtered on said gallium arsenide.

3. The method as claimed in claim 1 wherein said reactive ion etch plasma comprises a mixture of $CF_4$ and $H_2$ or a mixture of $CF_4$ and $O_2$.

4. The method as claimed in claim 1 wherein said step of recessing said $N^-$ layer comprises first exposing test samples to a reactive ion etch plasma at various power levels and for various times in order to determine a relationship between power, time and threshold voltage.

5. The method as claimed in claim 1 wherein said semiconductor comprises a high electron mobility semiconductor.

6. A method of forming a metal-semiconductor field-effect transistor (MESFET) comprising the steps of:
  providing a semiconductor having a dielectric film;
  implanting ions through said dielectric film to form an $N^-$ layer in a selected area of said semiconductor;
  forming a dummy gate on said dielectric film over said $N^-$ layer using a single-level photoresist process;
  implanting ions through said dielectric film to form an $N^+$ region in said selected area while using said dummy gate to mask said $N^-$ layer and retain an $N^-$ layer for the gate of said MESFET;
  reducing the length of said dummy gate by reactive ion etching;
  depositing an $SiO_x$ dielectric on said dielectric film covering said $N^+$ implanted region and on the portion of said $N^-$ layer not covered by said dummy gate, while using said dummy gate to mask the underlying portion of said $N^-$ layer;
  lifting off said dummy gate;
  annealing said $N^-$ layer and said $N^+$ region;
  etching source and drain openings in said dielectric film and in said $SiO_x$ dielectric;
  depositing ohmic metal contacts in said openings to form the source and drain of said MESFET;
  depositing gate metallization on said $N^-$ layer.

7. The method as claimed in claim 6, wherein said step of implanting ions to form an $N^-$ layer comprises implanting Se ions, and said step of implanting ions to form an $N^+$ region comprises implanting Si ions.

8. The method as claimed in claim 6, wherein said step of etching comprises dry etching.

* * * * *